United States Patent [19]

Dodt et al.

[11] Patent Number: 5,017,508

[45] Date of Patent: May 21, 1991

[54] METHOD OF ANNEALING FULLY-FABRICATED, RADIATION DAMAGED SEMICONDUCTOR DEVICES

[75] Inventors: Darcy T. Dodt, Palo Alto; Walter R. Buchanan, San Jose, both of Calif.

[73] Assignee: Ixys Corporation, San Jose, Calif.

[21] Appl. No.: 374,217

[22] Filed: Jun. 29, 1989

[51] Int. Cl.$^5$ .......................................... H01L 21/263
[52] U.S. Cl. .................................... 437/173; 437/174; 437/247; 437/939; 437/942; 437/17; 437/10; 148/4
[58] Field of Search ............... 437/173, 174, 247, 939, 437/942, 17, 10; 148/4

[56] References Cited

U.S. PATENT DOCUMENTS

| | | |
|---|---|---|
| 4,140,560 | 2/1979 | Rodov . |
| 4,151,008 | 4/1979 | Kirkpatrick .......................... 437/942 |
| 4,201,598 | 5/1980 | Tanaka et al. . |
| 4,331,485 | 5/1982 | Gat ...................................... 437/942 |
| 4,357,180 | 11/1982 | Molnar . |
| 4,376,657 | 3/1983 | Nagasawa et al. . |
| 4,469,527 | 9/1984 | Sugano et al. ......................... 437/17 |
| 4,472,206 | 9/1984 | Hodgson et al. . |
| 4,482,393 | 11/1984 | Nishiyama et al. . |
| 4,482,395 | 11/1984 | Hiramoto . |
| 4,576,652 | 3/1986 | Hovel et al. . |
| 4,698,486 | 10/1987 | Sheets . |
| 4,752,592 | 6/1988 | Tamura et al. . |
| 4,754,117 | 6/1988 | Suzuki et al. . |
| 4,771,016 | 9/1988 | Bajor et al. . |
| 4,794,217 | 12/1988 | Quan et al. . |

OTHER PUBLICATIONS

Baumgart et al., "Defect Formation in CW $CO_2$ Laser Annealed Silicon", in *Laser and Electron-Beam Interactions with Solids*, Appleton et al., Eds. (1981).

Wittmer et al., "Laser Annealing of Semiconductors: Mechanisms and Applications in Microelectronics", in *Current Topics in Materials Science*, vol. 8, Kaldis, Ed. (1982).

Carlson et al., "Lifetime Control in Silicon Power Devices by Electron or Gamma Irradiation", IEDM (1977) ED-24:1103-1108.

Lischner et al., "Rapid Large Area Annealing of Ion-Implanted Si with Incoherent Light", Pulse (1983) vol. 1.

Benton et al., "Characterization of Ion-Implanted Si Rapidly Annealed with Incoherent Light", Pulse (1983).

Schmitz et al., "High Performance Subhalf-Micrometer P-Channel Transistors for CMOS VLSI", IEDM (1984) pp. 423-426.

AG Associates, "Technical Newsletter", (Apr. 1985).

AG Associates, "Heatpulse Rapid Thermal Processing—Beyond the Limits of Furnace Technology", (date unknown).

Weinberg et al., "Reduction of Electron Hole Trappings in $SiO_2$ by Rapid Thermal Annealing", Pulse (1985).

Borisenko et al., "Incoherent Light-Induced Diffusion of Arsenic into Silicon from a Spin-On Source", Applied Phys. Letter (1983) 43:582-584.

(List continued on next page.)

Primary Examiner—Brian E. Hearn
Assistant Examiner—Gordon V. Hugo
Attorney, Agent, or Firm—Townsend and Townsend

[57] ABSTRACT

A method and apparatus for annealing devices having radiation induced damage is disclosed. A device is exposed to electron irradiation to induce damage to the active area. The device is then annealed with a rapid thermal anneal at a low temperature. The rapid thermal anneal may, optionally, be followed by a conventional oven or furnace anneal at a temperature of about 300° to 450° C. The method produces devices having improved and well controlled characteristics such as short circuit operating area, power dissipated during switching, and on-state voltage drop.

21 Claims, 3 Drawing Sheets

OTHER PUBLICATIONS

Baumgart et al., "Defect Control During Epitaxial Regrowth by Rapid Thermal Annealing", Mat. Res. Soc. Symp. Proc. (1983) 13:349–354.

Nulman, "Rapid Thermal Processing Integration and Equipment Advantages for Sub 0.5 Micron ULSI Technologies", AG Associates (1988).

Hefner et al., "A Performance Trade-Off for the Insulated Gate Bipolar Transistor: Buffer Layer Versus Base Lifetime Reduction", (1986).

AG Associates, Pulse (Apr. 1985)—Three articles.

Alessandrini et al., "TEM Study of the Two-Step Annealing of Arsenic-Implanted <100> Silicon", J. Vac. Sci. Tech. (1979) 16:342–344.

Csepregi et al., "Influence of Thermal History on the Residual Disorder in Implanted <111> Silicon", Radiation Effects (1976) 28:227–233.

Baliga, "Modern Power Devices", (date unknown), pp. 36–61.

Chen, "Minority Carrier Lifetime Killing Techniques for P-I-N Rectifiers", (1985), pp. 70–77.

Laser and Electron-Beam Interactions with Solids, Appleton and Celler, Eds., New York, N.Y., 1982, pp. 313–361.

Baliga et al., "The Insulated Gate Transistor (IGT)—A New Power Switching Device", reprinted from IEEE Ind. Appl. Soc. Meet. (1983) pp. 794–803.

Johnson, N. M., "Electronic Defects in Transient Thermally Processed Semiconductors", Mat. Res. Soc. Symp. Proc., vol. 35, *Energy Beam-Solid Interactions and Transient Thermal Processing*, 1984, Ed. Biegelsen, Rozgonyi, Shank (1984).

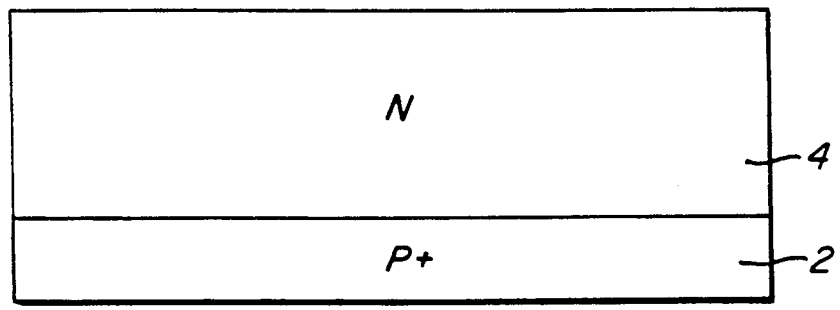
FIG._1a.
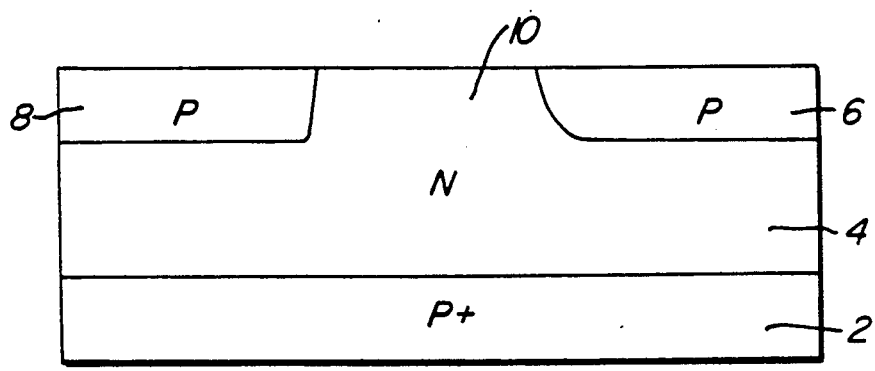
FIG._1b.
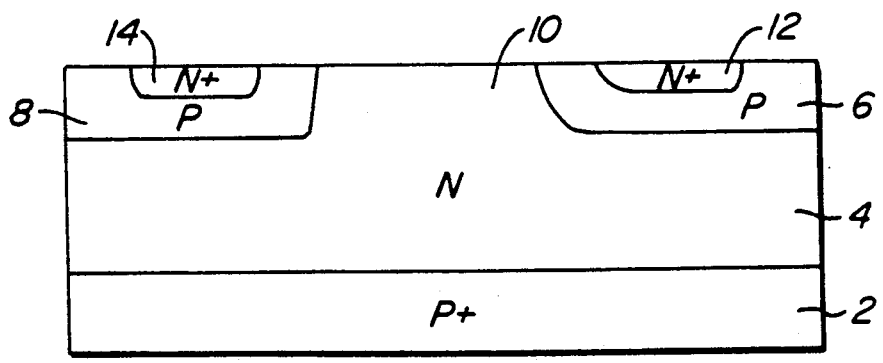
FIG._1c.

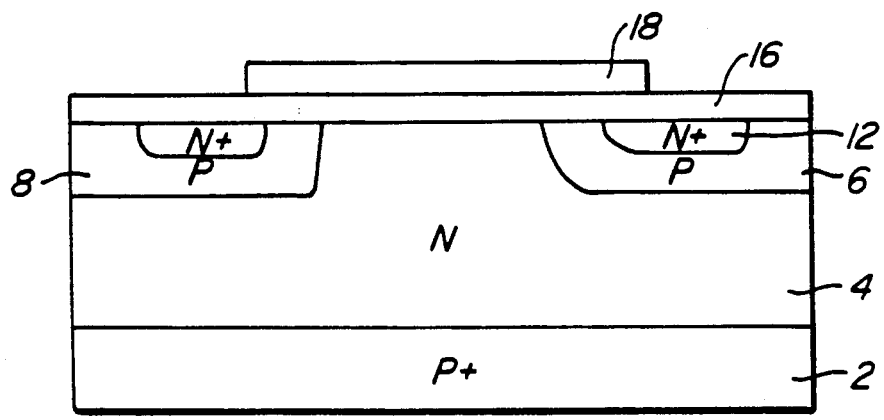
FIG._1d.
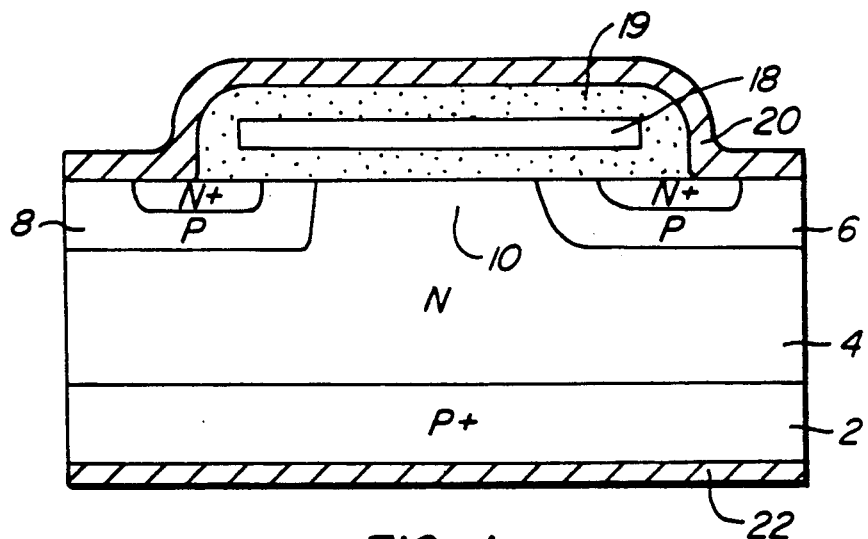
FIG._1e.

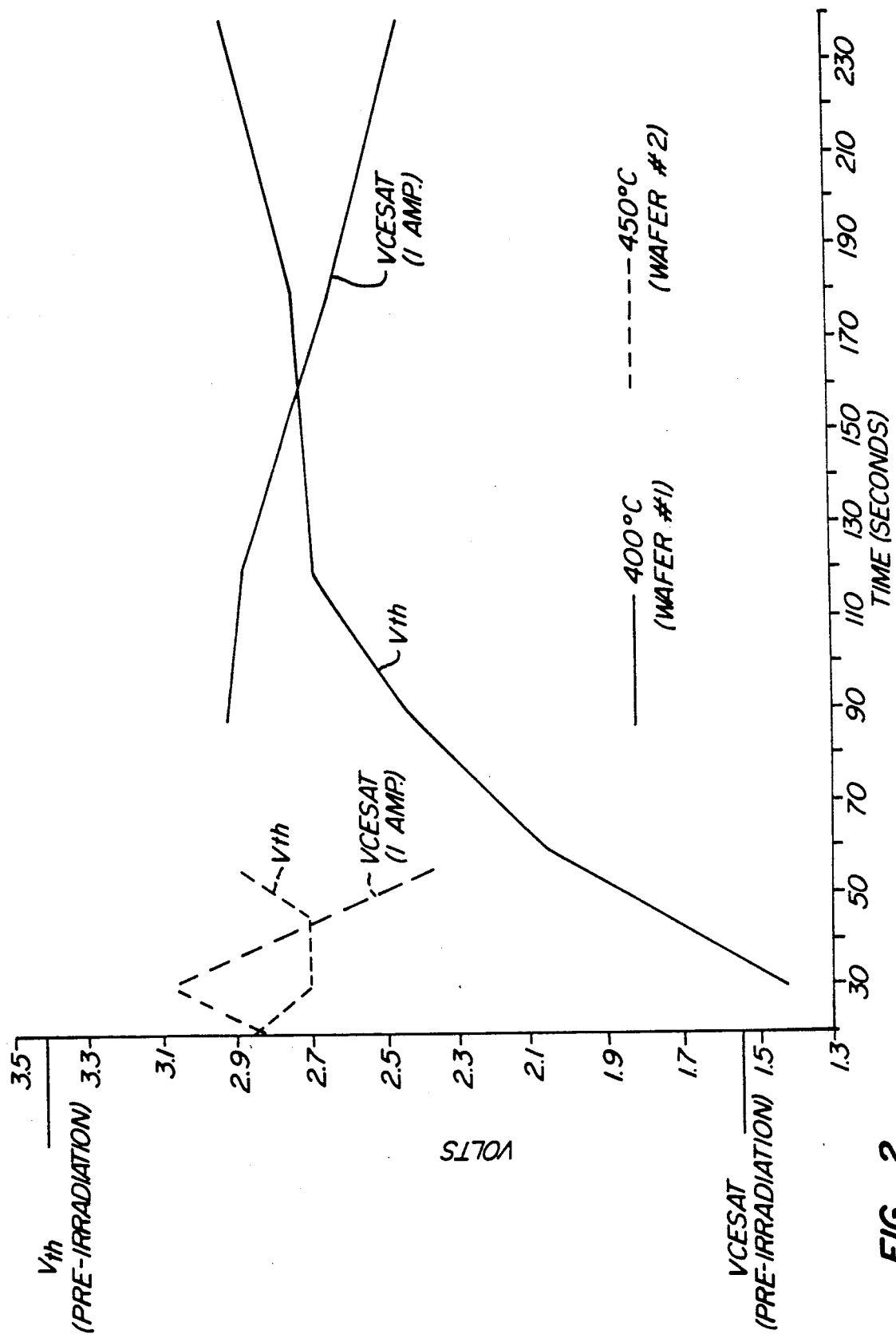
FIG._2.

METHOD OF ANNEALING FULLY-FABRICATED, RADIATION DAMAGED SEMICONDUCTOR DEVICES

BACKGROUND OF THE INVENTION

1. Field of the Invention

The present invention relates to the field of semiconductor devices and their manufacture. More particularly, the present invention provides an improved method and apparatus for annealing semiconductor wafers.

2. Description of Related Art

It is well known that control of minority carrier lifetime is important in integrated circuits such as high frequency silicon power devices. In the past, gold, platinum, or other impurities have been used to introduce recombination centers in a device so as to reduce minority carrier lifetimes.

It has been recognized that high energy electrons can also be used to control minority carrier lifetimes. High energy electrons may be introduced into a device, displacing silicon atoms or the like from their normal lattice positions. The displaced atoms interact with the silicon or dopant atoms to form combinations of atoms having energy levels between the normal conduction and valence bands of silicon. These energy levels act as recombination centers, much like the recombination centers that would be formed by gold or platinum atoms.

Electrons introduced into devices to induce such defects have been described as having energies from, for example, 0.8 to 12 MeV. Electrons of these energies may be produced using various types of electron accelerator devices, such as a transformer accelerator, a Van de Graff accelerator or, in the extreme, a linear accelerator.

Improved device characteristics are achieved using electron irradiation due to reduced minority carrier lifetimes. However, in order for the device to function properly, at least a portion of the damaged active area must be annealed. Annealing of electron irradiation induced damage has been performed using conventional oven or furnace baking techniques. The annealing process must be carefully controlled in order to produce acceptable device characteristics. For example, $V_{CE-SAT}$ (the voltage drop across an "on-state" switch) and $V_{th}$ (threshold voltage) must be carefully controlled and optimized in order to produce a fast device. Further, the annealing step must be carried out under conditions which do not have other adverse consequences on the device. For example, the anneal must be carried out at temperatures below the melting point of aluminum since electron irradiation and subsequent annealing are often carried out on a completed semiconductor wafer or device. Present annealing processes for electron irradiation induced damage do not provide sufficient control over the parameters which impact semiconductor performance and produce devices with undesirable characteristics. Electron irradiation, oven annealing, and their effect on device characteristics are discussed in, for example, Carlsen et al., "Lifetime Control in Si Power Devices", *IEEE Transactions in Power Devices*. Vol. 29, No. 8, page 1163 (Aug. 1977). Patents related to the field of electron irradiation induced damage of semiconductors include U.S. Pat. No. 4,201,598 (Tanaka et al.) which discloses electron-irradiation followed by conventional annealing.

It is desirable to provide a process and an apparatus for partially annealing elect-ron or gamma ray damaged devices so that D.C. electrical properties such as $V_{CE-SAT}$ and $V_{th}$ may be controlled and optimized while, simultaneously, not substantially increasing minority carrier lifetimes.

SUMMARY OF THE INVENTION

A method and apparatus for annealing semiconductor wafers and devices is disclosed, especially for use in devices having radiation induced damage. The process provides for control and optimization of D.C. electrical properties, such as $V_{CESAT}$ and $V_{th}$, while simultaneously not excessively increasing minority carrier lifetimes. The resulting device, further, has a higher short circuit safe operating area and lower energy dissipated during switching than conventionally annealed devices.

The radiation damage may be induced in a completed device, i.e., one having back metal and surface passivation. Electron irradiation is most preferred so as to be able to readily penetrate the surface of such a device.

In a preferred embodiment, the process of annealing a completed semiconductor device having electron beam induced damage is carried out in two steps. The first step is a rapid thermal anneal (RTA). The RTA may be followed by a conventional oven or furnace anneal, preferably at a temperature lower than the RTA.

In a most preferred embodiment, the RTA is carried out for between about 5 seconds and 10 minutes at less than 500° C. The optional conventional anneal is carried out for between about 5 and 120 minutes at 450° C. or less and, preferably, above 275° C.

Accordingly, in one embodiment the invention comprises the steps of irradiating a device so as to induce damage to said active area, the step of irradiating using radiation selected from the group consisting of electron beam irradiation, proton irradiation, neutron irradiation, alpha ray irradiation, and gamma ray irradiation; and partially annealing the irradiation induced damage, said annealing step further comprising the step of directing a high intensity light source at said radiation induced damage. The high intensity light source preferably has sufficient intensity to heat said device-at a rate greater than 15 degrees per second and the irradiating step uses energy of about 0.8 to 12 MeV. In a preferred embodiment the step of irradiating is conducted in a completed semiconductor device having metalization using electron beam irradiation.

In an alternative embodiment the method includes the steps of irradiating a semiconductor device with electron irradiation, the step of irradiating inducing damage in at least one active area of the semiconductor device; and annealing the semiconductor device with a rapid thermal anneal and an oven or furnace anneal, the rapid thermal anneal at least partially returning an on state voltage drop of the device to its original value, the device having an improved short circuit safe operating area.

In another embodiment the method includes the steps of irradiating a semiconductor device with electron irradiation, the step of irradiating inducing damage in at least one active area of the semiconductor device; and annealing the semiconductor device with a rapid thermal anneal and an oven or furnace anneal, said rapid thermal anneal at least partially returning an on state voltage drop of said device to its original value, said device having a desired energy dissipated during switching.

A semiconductor device is also disclosed. In one embodiment the device is manufactured by the steps of irradiating the device so as to induce damage to an active area, the step of irradiating using radiation selected from the group consisting of electron beam irradiation, proton irradiation, neutron irradiation, alpha ray irradiation, and gamma ray irradiation; and partially annealing the irradiation induced damage, the annealing step further comprising the step of directing a high intensity light source at the radiation induced damage.

BRIEF DESCRIPTION OF THE FIGURES

FIGS. 1a to 1e illustrate the fabrication of an Insulated Gate Field Effect Transistor ("IGFET") according to one embodiment of the invention.

FIG. 2 shows $V_{th}$ and $V_{CESAT}$ versus time for wafers annealed at 400 and 450° C.

DETAILED DESCRIPTION OF THE PREFERRED EMBODIMENTS

Physical damage to transistors, diodes, and other semiconductor devices caused by radiation is often desirable and is introduced into devices according to the method herein to reduce minority carrier lifetimes. By "radiation", it is intended to mean herein electron beam irradiation, gamma ray irradiation, or the like, although it will be apparent to those of skill in the art that electron beam irradiation will be used in preferred embodiments, particularly with completed semiconductor devices having full metalization. The induced damage often extends through the active region of the device, and is partially annealed for the device to function properly.

The anneal process is critical for producing acceptable D.C. electrical parameters in a device. For example, $V_{CESAT}$ (on state voltage drop) and $V_{th}$ (threshold voltage) are exemplary of the electrical parameters of the device which are impacted by the anneal process. The anneal described herein does not substantially increase minority carrier lifetimes (which in turn reduces switching time) and simultaneously provides desired $V_{CESAT}$ and $V_{th}$ values. Standard anneals carried out in conventional ovens or furnaces do not result in precise independent control of minority carrier lifetime in devices having irradiation induced damage.

Annealing has been utilized in the field of ion implantation. As high energy atoms enter the surface of a substrate crystal in the ion implantation process, the surface of the crystal is rendered amorphous at least to a degree. In order to partially or completely renew the original crystal structure of the substrate, annealing is performed. A variety of methods of annealing semiconductor substrates have been proposed including furnace annealing, and Rapid Thermal Annealing. Ion implantation, and annealing processes therefor are described in, for example, Sze, *VLSI Technology*. McGraw-Hill, Chapter Six (1983).

Rapid thermal annealing ("RTA") generally utilizes laser beams with energy densities between about 1 and 100 Joules/cm². The use of lasers or tungsten halogen-lamps enables an implanted layer to be annealed for a few seconds at temperatures up to 1000° C. and permits annealing with limited diffusion of implants. RTA is discussed in Baumgart et al., "Defect Formation in CW Co₂ Laser Annealed Silicon", in *Laser and Electron Beam Interactions with Solids*. North-Holland, N.Y., 1982.

In a preferred embodiment, the method disclosed herein includes a Rapid Thermal Anneal (RTA) under controlled conditions. By Rapid Thermal Anneal, it is intended herein to mean that the device is heated at a rate exceeding 15° C. per second and, most preferably, exceeding 30° C. per second using preferably, a light source. The RTA may, purely by way of example be carried out in a tungsten halogen lamp annealing device having model no. 610, manufactured by A.G. Associates. The RTA is optionally followed by a conventional furnace or oven anneal at a low temperature.

The RTA is preferably a short RTA. By "short" it is intended to mean herein that the anneal is carried out between about 5 seconds and 10 minutes. The RTA is preferably carried out such that measured temperatures in the wafer are less than 500° C.

The RTA is in a preferred embodiment followed by a conventional anneal carried out at temperatures between about 275° C. and 450° C. for between about 5 and 120 minutes. Stated in the alternative, the RTA and optional conventional anneal are carried out under conditions sufficient to provide a device within 50% or more of its original value of $V_{CESAT}$. In a preferred embodiment $V_{CESAT}$ is within 90% or more of its original value of $V_{CESAT}$.

FIG. 1 illustrates the process disclosed herein as it is applied in the fabrication of an insulated gate field effect transistor. As shown in FIG. 1a, a substrate 2 is provided which may be, for example a P+ silicon substrate having a resistivity of, for example about 0.08 ohm-cm. An epitaxial N-type region is deposited on the P— substrate using chemical vapor deposition techniques of the type readily known to those of skill of the art.

As shown in FIG. 1b, using masking and ion implantation techniques, P regions 6 and 8 are formed in epitaxial region 4 and separated by channel region 10. P regions 6 and 8 are doped with, for example, boron so as to have a net acceptor concentration of about $1 \times 10^{16}/cm^3$ or greater.

Thereafter, as shown in FIG. 1c, masking and implantation techniques are again applied so as to form N+ region 12 and 14 in the P regions 6 and 8 respectively.

In FIG. 1d, an oxide layer 16 is grown over the surface of the device and a doped polysilicon gate 18 is deposited thereon. The gate preferably extends over the entire channel region 10 and over at least a portion of P regions 6 and 8 and N+ regions 12 and 14.

As shown in FIG. 1e, the oxide region 16 is then selectively masked and etched so as to extend only a short distance out from the gate and additional oxide 19 grown on the top and sides of the gate. Metal region 20 is deposited over the top of the device. Passivation such as silicon nitride and metal region 22 are then deposited on the substrate.

The completed device shown in FIG. 1e is, thereafter, bombarded with high energy (e.g. 1 to 100 MeV, and preferably about 0.8 to 12 MeV, and most preferably 2, 4, 6, 8, 10, or 12 MeV) electrons, gamma ray irradiation or the like so as to induce point defects in at least the channel region 10. The wafer is then annealed using a Rapid Thermal Anneal, as described above, followed by an optional conventional anneal.

EXAMPLE

The technique is illustrated below as it was applied to insulated gate bipolar transistors (IGBT). The wafers, complete with back metal and surface passivation were irradiated with high energy electrons in a linear accelerator, using energies in the range described by Carlsen et al. (cited above). Two of the wafers were then annealed in an RTA system having model no. 610 and manufactured by A.G. Associates. The wafers were annealed with one bank of tungsten-halogen source lamps in forming gas. Wafer #1 was annealed at 450° C. for a total of 240 seconds in short pulse widths (i.e. pulse widths of about 30 seconds). Wafer #2 was annealed at 450° C. for a total of 55 seconds with pulse widths varying from about 20 seconds to about 10 seconds. Both $V_{th}$ and $V_{CESAT}$ were then measured by a Tektronix curve tracer after each pulse.

The resulting data are shown in Table 1 and illustrated in FIG. 2. Table 1 and FIG. 2 also show the pre-irradiation values for both $V_{th}$ and $V_{CESAT}$. As shown in FIG. 1 both wafers were generally annealing back to their pre-irradiation values. $V_{th}$ tends to anneal faster than $V_{CESAT}$. For example, with wafer #1 after 120 seconds, $V_{th}$ has recovered such that it is only 22% less than its pre-irradiation value, while $V_{CESAT}$ is still 84% less than its pre-irradiation value. At 240 seconds, $V_{th}$ has recovered to within 15% of its original while $V_{CESAT}$ is still only within 56% of its pre-irradiation value. Similarly, for wafer #2 after 55 seconds, $V_{th}$ is within 15.5% of its pre-irradiation value while $V_{CESAT}$ is only within 51% of its pre-irradiation value. The data for wafer #2 at 20 seconds appear to be inconsistent with the remaining data. This inconsistency may have arisen due to temperature measurements on the wafer which have been found to vary to a small degree as a function of lateral location in the wafer.

The data from FIG. 1 illustrate that greater control of the annealing of electron radiation induced damage maybe achieved at temperatures below 450° C. using a rapid thermal anneal. At temperatures of 450° or greater $V_{th}$ and $V_{CESAT}$ anneal at a rate which is too fast for predictable control of these device parameters based on the data in Table 1. Conversely, 450° C. anneals have the benefit of faster processing time and may be useful as additional data are obtained so as to gain optional control over the wafer parameters. In any event, the use of rapid thermal annealing provides better control over the device parameters than would a conventional anneal.

TABLE 1

| | Results of Rapid Thermal Anneal | | | |
|---|---|---|---|---|
| Wafer | Temp | Time | $V_{th}$ | $V_{CESAT}$ @ 1A |
| 1 | 400 C. | 30s | 1.43V | — |
| | | 60s | 2.06V | — |
| | | 90s | 2.43V | 2.90V |
| | | 120s | 2.68V | 2.86V |
| | | 180s | 2.72V | 2.63V |
| | | 240s | 2.90V | 2.43V |
| 2 | 450 C. | 20s | 2.84V | 2.81V |
| | | 30s | 2.70V | 3.09V |
| | | 45s | 2.71V | 2.63V |
| | | 55s | 2.87V | 2.35V |
| Pre-irradiation | | | 3.4V | 1.55V |

Wafer #1 and #2, along with a third wafer that had not undergone RTA, were then annealed in an oven at 350° C. for two hours in forming gas. As shown in Table 2 $V_{th}$ and $V_{CESAT}$, at low current, almost fully recovered for all three wafers.

TABLE 2

| $V_{th}$ and $V_{CESAT}$ for RTA'd and Non-RTA'd Wafers | | |
|---|---|---|
| Wafer | $V_{th}$ | $V_{CESAT}$ @ 1A |
| 1 | 3.43V | 1.64V |
| 2 | 3.35V | 1.55V |
| 3 | 3.40V | 2.0V |
| Pre-irradiation | 3.4 | 1.55 |

The devices were then assembled in conventional hermetic packages for high current testing, and the results of the high current testing data are illustrated in Table 3. Data are shown for $V_{CESAT}$ at 20 Amps, as well as for $E_{off}$ (the energy dissipated during switching) and SCSOA (the short circuit safe operating area).

TABLE 3

| Performance Comparison of Completed Wafers | | | | |
|---|---|---|---|---|
| Wafer | $V_{th}$ | $V_{CESAT}$ @ 20A | $E_{off}$ @ 125 C | SCSOA |
| 1 | 3.47V | 2.90V | 4.21 mJ | 13V |
| 2 | 3.36V | 2.64V | 5.6 mJ | 13V |
| 3 | 3.4V | 3.01V | 6.5 mJ | 10V |

Wafer #1 has a $V_{CESAT}$ at 20 Amps which is only 4% lower than for the "standard" wafer #3. Wafer #2 has a $V_{CESAT}$ which is only 9% lower than wafer #3. However, it is seen that wafer #1 has a value of $E_{off}$ that is 36% lower than wafer #3 and wafer #2 has a value of $E_{off}$ that is 14% lower than wafer #3. Therefore, it is seen that the method disclosed herein can be used to carefully control and optimize the tradeoff between $E_{off}$ and $V_{CESAT}$. The devices constructed by the method disclosed herein have only a marginally lower $V_{CESAT}$, but have a substantially lower $E_{off}$. Again it is seen that when the RTA is conducted at 450° C. or less, good results are obtained, while especially good results are obtained when the wafers are RTA'd at 400° C. or less. It should be noted, however, that different anneal times at 450° C. might result in similar device characteristics. In any event, greater control is achieved using an RTA rather than a conventional anneal alone. By providing lower values of $E_{off}$ less heat is dissipated during switching, enabling the use of smaller devices, higher density, and the like.

The method disclosed herein also results in improved performance in the SCSOA. The SCSOA is tested by, for example, shorting the collector and to the power supply while the emitter is grounded transistor for 10 $\mu$s. The higher the gate voltage, the higher the current that will flow through the transistor. Both of the RTA'd transistors performed better than the standard device, having a SCSOA of 13 v. rather than 10 v.

It is to be understood that the above description is intended to be illustrative and not restrictive. Many embodiments will be apparent to those of skill in the art upon reviewing the above description. By way of example the Rapid Thermal Annealing step could be carried out with tungsten halogen lamps, lasers, or the like. Further, the device could be rendered amorphous by use of radiation other than electron beam radiation such as gamma ray irradiation, proton irradiation, neutron irradiation, alpha ray irradiation, and the like. The scope of the invention should, therefore, be determined not with reference to the above description, but should instead be determined with reference to the appended claims, along with the full scope of equivalents to which such claims are entitled.

What is claimed is:

1. A method of producing a semiconductor device, said semiconductor device having an active area thereon, comprising the steps of:
   a. irradiating a completely fabricated semiconductor device so as to induce damage to an active area thereon, said step of irradiating using radiation selected from the group consisting of electron beam irradiation, proton irradiation, neutron irradiation, alpha ray irradiation, and gamma ray irradiation; and
   b. partially annealing said irradiation induced damage, said annealing step further comprising the step of directing a high intensity light source at said radiation induced damage.

2. The method as recited in claim 1 wherein said, high intensity light source has an intensity sufficient to heat said device at a rate greater than about 15° C. per second.

3. The method as recited in claim 1 wherein said radiation is electron beam irradiation.

4. The method as recited in claim 1 wherein said step of partially annealing is followed by a step of furnace annealing.

5. The method as recited in claim 1 wherein said step of partially annealing is followed by a step of oven annealing.

6. The method as recited in claim 1 wherein said step of directing a light source is a step of directing said light source for between about 5 seconds and 10 minutes.

7. The method as recited in claim 1 wherein said step of directing a light source is a step of directing said light source for between about 10 and 30 seconds.

8. The method as recited in claim 1 wherein said step of partially annealing is a step of annealing said damage at below 500° C.

9. The method as recited in claim 1 wherein said step of partially annealing is a step of annealing said damage at between about 400 and 450° C.

10. The method as recited in claim 1 wherein said step of partially annealing is a step of annealing said damage at or below 400° C.

11. The method as recited in claim 4 wherein said step of oven annealing is carried out between about 275 and 450° C. for between about 5 and 120 minutes.

12. The method as recited in claim 5 wherein said step of oven annealing is carried out at about 350° C.

13. The method as recited in claim 1 wherein said step of partially annealing returns the on state voltage drop of said device to within 50% or more of its pre-irradiation value.

14. The method as recited in claim 1 wherein said step of partially annealing returns the on state voltage drop of said device to within 90% or more of its pre-irradiation value.

15. A method of producing a semiconductor device having a desired short circuit safe operating area comprising the steps of:
   a. irradiating a completely fabricated semiconductor device with electron irradiation, said step of irradiating inducing damage in at least one active area of said semiconductor device; and
   b. annealing said semiconductor device with a rapid thermal anneal and an oven or furnace anneal, said rapid thermal anneal at least partially returning an on state voltage drop of said device to its original value, said device having said desired short circuit safe operating area.

16. A method of producing a semiconductor device having a desired energy dissipated during switching comprising the steps of:
   a. irradiating a completely fabricated semiconductor device with electron irradiation, said step of irradiating including damage in at least one active area of said semiconductor device; and
   b. annealing said semiconductor device with a rapid thermal anneal and or not followed by an oven or furnace anneal, said rapid thermal anneal at least partially returning an on state voltage drop of said device to its original value, said device having a desired energy dissipated during switching following said oven or furnace anneal.

17. The method as recited in claim 16 wherein said short circuit operating area is greater than a short circuit operating area in a device annealed only with said oven or furnace anneal.

18. The method as recited in claim 16 wherein said energy dissipated during switching is less than a energy dissipated during switching in a device annealed only with said oven or furnace anneal.

19. A method of fabricating a semiconductor device having a desired short circuit safe operating area and energy dissipated during switching comprising the steps of:
   a. providing a device having at least back metal and one active area thereon;
   b. irradiating said device with electron beam radiation, said radiation having energy between about 1 meV and 20 meV, said radiation inducing damage in said active area causing $V_{CESAT}$ of said device to change;
   c. annealing said device with a rapid thermal anneal for between about 5 seconds and 10 minutes, said Rapid Thermal Anneal heating said device to between about 400 and 450° C.; and
   d. annealing said device in an oven or furnace said rapid thermal anneal and said oven or furnace anneal causing $V_{CESAT}$ for said device to approach the value of $V_{CESAT}$ of said device before said irradiating step, said device having a short circuit operating area greater than a short circuit operating area of a device annealed only with said oven or furnace anneal and an energy dissipated during switching less than a device annealed only with said oven or furnace anneal.

20. The method as recited in claim 19 wherein said device comprises at least one insulated gate bipolar transistor.

21. The method of claim 1 with said completely fabricated semiconductor device being a semiconductor device having back metal and surface passivation.